(12) United States Patent
Delchambre et al.

(10) Patent No.: US 10,483,723 B2
(45) Date of Patent: Nov. 19, 2019

(54) POWER AMPLIFICATION DEVICE

(71) Applicant: ENE29 S.A.R.L., Luxembourg (LU)

(72) Inventors: Michaël Delchambre, Toulouse (FR);
Romain Pecquois, Toulouse (FR);
Nicolas Innocenti, Toulouse (FR);
David Genez, Cugnaux (FR)

(73) Assignee: ENE29 S.A.R.L., Luxembourg (LU)

( * ) Notice: Subject to any disclaimer, the term of this patent is extended or adjusted under 35 U.S.C. 154(b) by 0 days.

(21) Appl. No.: 16/308,924

(22) PCT Filed: Jun. 23, 2017

(86) PCT No.: PCT/EP2017/065581
§ 371 (c)(1),
(2) Date: Dec. 11, 2018

(87) PCT Pub. No.: WO2018/001905
PCT Pub. Date: Jan. 4, 2018

(65) Prior Publication Data
US 2019/0148919 A1    May 16, 2019

(30) Foreign Application Priority Data

Jun. 28, 2016 (FR) .................................. 16 56005

(51) Int. Cl.
*H01T 2/02* (2006.01)
*H01T 1/22* (2006.01)
(Continued)

(52) U.S. Cl.
CPC ................. *H01T 2/02* (2013.01); *H01T 1/22* (2013.01); *H01T 15/00* (2013.01); *H03K 3/537* (2013.01); *H01T 1/20* (2013.01)

(58) Field of Classification Search
CPC .. H01T 2/02; H01T 1/22; H01T 15/00; H01T 1/20; H03K 3/537
See application file for complete search history.

(56) References Cited

U.S. PATENT DOCUMENTS 4,558,280 A * 12/1985 Koehl ..................... F02P 11/06
324/399
4,631,451 A * 12/1986 Anderson ............... H01T 13/52
123/620

(Continued)

OTHER PUBLICATIONS

Search Report from French Intellectual Property Office on corresponding FR application (FR1656005) dated Mar. 7, 2017.

(Continued)

*Primary Examiner* — Kevin Quarterman
(74) *Attorney, Agent, or Firm* — Klein, O'Neill & Singh, LLP

(57) ABSTRACT

The present invention relates to a power amplification device capable of being powered by a single input voltage and comprising a switching module comprising a first discharge electrode and a second discharge electrode. The power amplification device comprises a triggering module configured to convert the input voltage into a first supply voltage and a second supply voltage, detect an activation event, generate an activation signal from the first supply voltage when an activation event has been detected, generate a pulse command from the second supply voltage when an activation signal has been generated, and transmit the generated pulse control to the triggering means of the switching module so that it triggers the formation of an electric arc between the first discharge electrode and the second discharge electrode.

10 Claims, 2 Drawing Sheets

(51) Int. Cl.
    *H01T 15/00*    (2006.01)
    *H03K 3/537*    (2006.01)
    *H01T 1/20*     (2006.01)

(56)         References Cited

U.S. PATENT DOCUMENTS 5,043,636    A      8/1991   Klopotek et al.
    2001/0030541 A1 *  10/2001   Fujita .................... H01T 19/00
                                                                 324/455
    2004/0179317 A1    9/2004   Lee et al.
    2007/0165351 A1    7/2007   Menke
    2009/0154044 A1 *  6/2009   Crevenat ................ H01T 2/02
                                                                 361/91.1

OTHER PUBLICATIONS

International Search Report and Written Opinion on corresponding PCT application (PCT/EP2017/065581) from International Searching Authority (EP) dated Sep. 22, 2017.

* cited by examiner

POWER AMPLIFICATION DEVICE

TECHNICAL FIELD

The present invention relates to the field of power electronics and relates more specifically to a power amplification device. Such a device is particularly applied in the scope of a bench for testing highly pressurised materials, a bench for testing a charge or in the scope of a downhole seismic application.

PRIOR ART

In power electronics, power amplification devices are known that make it possible to transfer, in a fraction of a second, a highly pressurised current of very high intensity between two electrodes, the polarisation voltage between the two electrodes being provided by an external supply, for example between 5 and 40 kV.

Such power amplification devices are generally used in applications such as Marx generators or other highly pressurised assemblies, for example in association with condensers making it possible to store electrical energy, and to return it in the form of a highly pressurised current of very high intensity. Two categories of devices are distinguished: gas devices and triggered devices.

A gas power amplification device is triggered autonomously. To this end, such a device comprises two separate electrodes, of one interval, and arranged opposite one another in a gaseous environment or in the vacuum. An example of a gas power amplification device is described in application FR2999350A1 filed by the Applicant. When the voltage defined between the electrodes exceeds a threshold value, an electric arc is created and the current is allowed to pass. This threshold value depends on the geometry of the electrodes, on the distance between the electrodes and on the pressure of the environment wherein the electrodes are arranged. Such a device is of simple design, but has the disadvantage of being relatively unreliable, given that in a gaseous environment or in the vacuum, the triggering value, in reality, follows a Gaussian distribution around the desired threshold value.

A triggered power amplification device uses a means to trigger the generation of the electric arc between two main electrodes. For example, a known type of triggered power amplification device, called trigatron, uses a third electrode, called triggering electrode, positioned near the gap separating the two main electrodes, for example orthogonally to the two main electrodes or coaxially to one of them, to trigger the generation of the electric arc.

FIG. 1 schematically illustrates an example of a triggered power amplification device 1 comprising two main electrodes 2 and 3 and a triggering electrode 4. The triggering electrode 4 is connected to an external current generator 5 delivering a high voltage pulse (of around a few kV maximum) via a "low voltage" supply cable 6 while the main electrodes 2 and 3 are connected to an external current generator 7 delivering a high voltage (of a few kV or a few dozen kV) via a "high voltage" supply cable 8. When the device is switched on, the voltage applied to the triggering electrode 4 makes it possible to create an ionised air channel A1 in the space E between the two main electrodes 2, 3. This ionisation facilitates the creation of a second electric arc A2 (or main electric arc) between the two main electrodes 2, 3, thus allowing the current to pass. As an example, from document EP0300599, a power amplification device comprising two main electrodes arranged opposite one another is known, between which an electric arc forms by applying a voltage on a triggering electrode mounted coaxially inside one of the two main electrodes.

A triggered power amplification device is significantly more stable than a gas power amplification device, since it is always triggered at the same threshold value. However, when it is triggered by exceeding a self-priming threshold, a triggered power amplification device is difficult to adjust, which represents a first disadvantage. Furthermore, using an external current generator to deliver a pulse to the triggering electrode has a significant limitation for an embedded use, in particular in the case of a borehole wherein it is necessary to lower both the supply cable of the triggering electrode and the high voltage supply cable of the main electrodes. In addition, certain applications such as the Marx generator, can require the use of numerous interconnected triggered power amplification devices, for example in a parallel assembly, with numerous condensers. Thus, the result is a great cabling complexity, in particular to return the anode of each power amplification device to the anode of the nearby condensers, which is added to the cablings of the triggering electrode and of the main electrodes of each triggered power amplification device, which also has significant disadvantages.

DESCRIPTION OF THE INVENTION

The purpose of the present invention is to overcome, at least partially, these disadvantages by proposing a simple, reliable and effective solution of a power amplification device not requiring complex external cabling in order to be able to be used in an embedded application, for example in a downhole for a seismic application.

To this end, the invention first relates to a power amplification device capable of being powered by a single input voltage and comprising a switching module, said switching module comprising a first discharge electrode and a second discharge electrode, arranged opposite one another at a predetermined set distance defining a space for generating an electric arc, and a triggering means located near said space and being configured to trigger the formation of said electric arc in said space, said power amplification device being noteworthy in that it comprises a triggering module, configured to convert the input voltage into a first supply voltage and into a second supply voltage, to detect an activation event, to generate, from the first supply voltage, an activation signal when an activation event has been detected, to generate, from the second supply voltage, a pulse command when an activation signal has been generated, and to transmit the pulse command generated to the triggering means of the switching module, so that the triggering means triggers the formation of an electric arc between the first discharge electrode and the second discharge electrode.

The input voltage is a high voltage of which the value is greater than 1 kV, preferably between 5 and 40 kV. The power amplification device according to the invention is a self-triggered device which functions with one single input voltage and therefore one single external supply cable, which makes it possible to reduce the number of cables and does not therefore require any connector with the outside to control the triggering means nor any additional battery, the supply thereof being advantageously controlled by the second voltage. The dimensions of the power amplification device according to the invention may be advantageously reduced so as to be embedded in a casing, for example to easily lower it into a borehole. The triggering module of the device according to the invention may be used with most configurations and known types of discharge electrodes and triggering means. The device according to the invention further provides stability and precision when triggering the electric arc, regardless of the geometry of the electrodes, of the distance between the first electrode and the second electrode or of the pressure of the environment, which means the amplification device may be used longer without undergoing maintenance operations.

Preferably, the triggering module comprises a voltage converter, a detection sub-module and a pulse generator, the voltage converter being configured to convert the input voltage into the first supply voltage and into the second supply voltage, the first voltage making it possible to power the detection module, the second voltage making it possible to power the pulse generator.

In a first embodiment of the device, the triggering module is configured to compare the value of the input voltage with a predetermined threshold value and to generate the activation signal when the value of the input voltage is greater than or equal to the predetermined threshold value. In this case, using a voltage criterion to trigger the electric arc makes it possible to make the device independent of time, and in particular, of the charging time of the condensers of the current generator, which powers it with the input voltage.

Advantageously, in this first embodiment, the detection sub-module is configured to receive the input voltage, to compare the value of the input voltage with a predetermined threshold value and, when the value of the input voltage is greater than or equal to the predetermined threshold value, to generate the activation signal from the first supply voltage and to send said activation signal to the pulse generator.

Preferably, the delay between the detection of the predetermined threshold value by the detection sub-module and the start of the current transfer by the triggering means is less than 100 µs.

In a second embodiment of the device, the triggering module comprises a timer and is configured to generate the activation signal periodically relying on said timer.

Advantageously, in this second embodiment, the detection sub-module comprises the timer and is configured to periodically generate the activation signal from the first supply voltage and to send said activation signal to the pulse generator.

Preferably, the triggering means is presented in the form of a triggering electrode.

Preferably, the value of the first voltage is between 1 and 15V.

Advantageously, the activation signal is presented in the form of a voltage step of which the amplitude is less than 15V.

Advantageously, the value of the amplitude of the voltage step is equal to the value of the first voltage.

Advantageously also, the value of the second voltage is around several hundred Volts, preferably around 500V.

According to an aspect of the invention, the pulse command is presented in the form of a voltage pulse signal of which the duration is between 0.5 and 10 µs.

According to another aspect of the invention, the voltage pulse signal reaches a maximum value of around 20 kV, making it possible for the triggering means to trigger the formation of the electric arc between the first discharge electrode and the second discharge electrode.

The invention also relates to a power amplification system comprising a power amplification device such as presented above, and a current generator delivering a voltage of several kilovolts, preferably between 5 and 40 kV, at the input of said power amplification device.

The invention also relates to a method for generating an electric arc between a first discharge electrode and a second discharge electrode, arranged opposite one another at a predetermined set distance defining a space for generating an electric arc, the generation of said electric arc being triggered by a triggering means located near said space, said method, implemented by a power amplification device, powered by an input voltage, comprising the steps of:
- converting the input voltage into a first supply voltage and into a second supply voltage,
- detecting an activation event,
- generating, from the first supply voltage, an activation signal when an activation event has been detected,
- generating, from the second supply voltage, a pulse command when an activation signal has been generated, and
- transmitting said pulse command, generated by the triggering means so that the triggering means triggers the formation of an electric arc between the first discharge electrode and the second discharge electrode.

In a first embodiment, the method comprises a step of comparing the value of the input voltage with a predetermined threshold value and the activation signal is generated when the value of the input voltage is greater than or equal to the predetermined threshold value.

In a second embodiment, the triggering module comprising a timer, the activation signal is generated periodically relying on said timer.

Other characteristics and advantages of the invention will appear in the following description, with reference to the appended figures and given as non-limiting examples and wherein identical references are given to similar objects.

DETAILED DESCRIPTION OF EMBODIMENTS OF THE INVENTION

The power amplification device according to the invention is a switching device of the close switch type, comprising two separate electrodes, called discharge electrodes, separated by a dielectric (gas, vapour, vacuum, etc.), between which is formed an electric arc when the potential difference between the electrodes is greater than a threshold value. In such a high voltage device, this threshold value is greater than a few kV (kilovolts), and the operating voltage of the device (voltage applied to the power amplification device, i.e. the potential difference between the electrodes thereof), may go up to 1 MV. Such a power amplification device makes it possible to transfer a quantity of electrical charges going from a few millicoulombs to several hundred coulombs, corresponding to an electrical current passing through the power amplification device with an intensity of between 1 kA and 1 MA. Associated with a current generator, and in particular with one or more condensers capable of accumulating the quantities of the abovementioned electrical charges, this device may be used for various applications. The power amplification device according to the invention is a self-triggered power amplification device which is powered only by one single current generator. As an example, the device according to the invention may be used to sequentially power a bench for testing highly pressurised materials or any other charge, or in a borehole with a seismic purpose, for example to stimulate the production of petroleum. Each condenser discharge and charge transfer operation by the power amplification device, of the electrical charges initially accumulated in the condenser, is called a shot.

Figure 1:
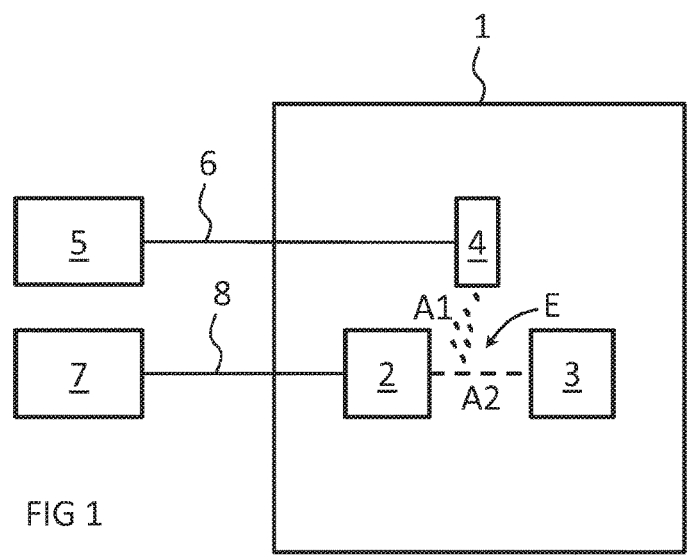
FIG. 1 (already outlined) schematically illustrates a triggered power amplification device of the prior art.
Figure 2:
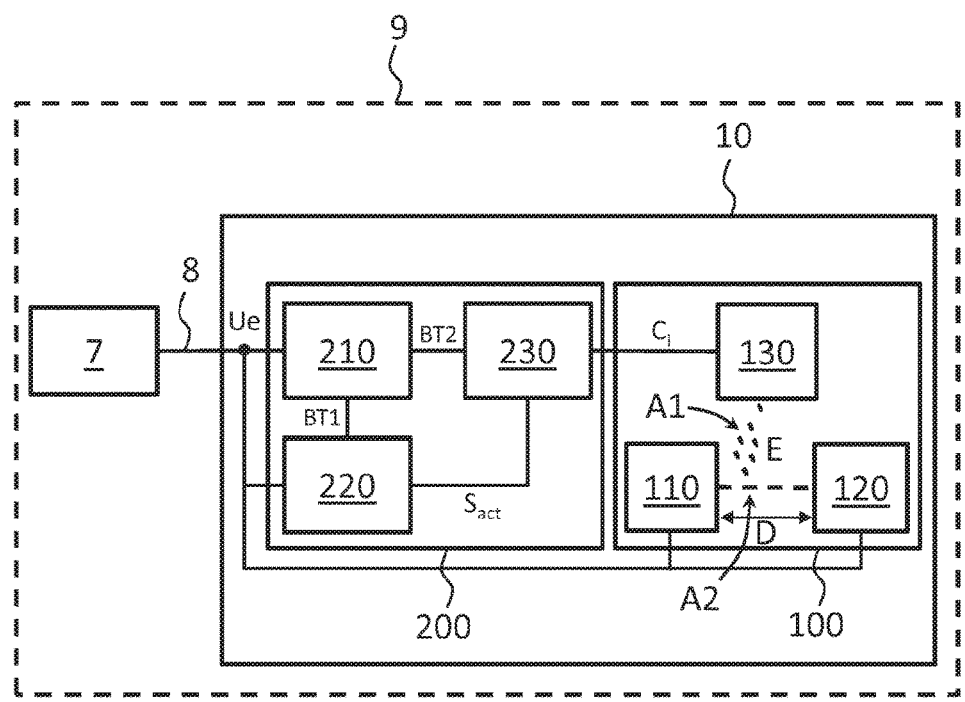
FIG. 2 schematically illustrates an embodiment of a power amplification system according to the invention.

In FIG. 2, an embodiment of a system 9 according to the invention has been represented. This system 9 comprises a power amplification device 10 and a current generator 7 delivering one single input voltage Ue to the device 10 via a high voltage supply cable 8.

The device 10 comprises a switching module 100 and a triggering module 200.

The switching module 100 comprises a first discharge electrode 110 and a second discharge electrode 120 arranged opposite one another at a predetermined set distance D and defining a space E for generating an electric arc A2 from the input voltage Ue. To do this, the current generator 7 comprises one or more condensers which are charged over time so as to deliver an increasing voltage Ue which could reach several kV, for example between 5 and 40 kV, until the formation of the electric arc A2 between the first discharge electrode 110 and a second discharge electrode 120 as will be explained below.

The switching module 100 then comprises a triggering means located near the space E and which is configured to trigger the formation of an electric arc A2 in said space E. In this example, this triggering means is presented in the form of a third electrode, called triggering electrode 130. This triggering electrode 130 makes it possible to create an ionised air channel A1 in the space E, facilitating the formation of the electric arc A2 (called main electric arc) between the first discharge electrode 110 and the second discharge electrode 120, thus allowing the current to pass.

In a known manner, during a shot, the electrical charges are propagated from the connecting end of the first discharge electrode 110 towards the end of the second discharge electrode 120 through the space E.

The first discharge electrode 110 and the second discharge electrode 120 are preferably of a generally hollow and cylindrical shape, circularly-symmetrical. In a known manner the first discharge electrode 110 and the second discharge electrode 120 are aligned "end-to-end", i.e. arranged such that the respective longitudinal axes thereof (not represented) coincide and that they have axial ends (not represented), called closing ends, at a predetermined set distance D from one another, for example between around 1 and 15 mm from one another, and opposite in the axial direction (direction of the axes of symmetry).

The electric arc A2 occurs between these axial closing ends, of which the opposite annular end faces are substantially flat (in the transverse planes). The axial ends opposite the electrodes, called connecting ends, are each connected to a connector (not represented) for the purpose of integrating the power amplification device in an electrical circuit. In particular, one of the connectors is used for the connection of the current generator 7 and the other is used for the connection of a charge, for example.

The triggering module 200 is connected to the switching module 100 in order to control it. The triggering module 200 is configured to convert the input voltage Ue into a first supply voltage BT1 and into a second supply voltage BT2, to detect an activation event and to generate, from the first supply voltage BT1, an activation signal $S_{act}$ when an activation event has been detected.

To this end, in the preferred embodiment illustrated in FIG. 2, the triggering module 200 comprises a voltage converter 210, a detection sub-module 220 and a pulse generator 230.

The voltage converter 210 is configured to convert the input voltage Ue provided by the external current generator 7 into a first supply voltage BT1 and into a second supply voltage BT2. The first supply voltage BT1, preferably of around a few Volts (for example, 5V), makes it possible to power the detection sub-module 220 with electrical energy. The second supply voltage BT2, preferably of around a few hundred Volts (for example, 500V), makes it possible to power the pulse generator 230 with electrical energy.

In a first embodiment, the detection sub-module 220 is configured to receive the input voltage Ue provided by the current generator 7, to compare the value of said input voltage Ue with a predetermined threshold value Uc and, when the value of the input voltage Ue is greater than or equal to the predetermined threshold value Uc, to generate an activation signal $S_{act}$ from the first supply voltage BT1 and to send said activation signal $S_{act}$ to the pulse generator 230. In this case, the detection of the exceeding of the predetermined threshold value Uc by the input voltage Ue constitutes the activation event. Preferably, in reference to FIG. 6, the delay $\Delta T1$ between the detection of the predetermined threshold value by the detection sub-module 220 and the start of the current transfer by the triggering electrode 130 is less than 100 μs.

In a second embodiment of the device, the detection sub-module 220 comprises a timer (not represented) and is configured to generate the activation signal $S_{act}$ periodically from said timer and to send said activation signal $S_{act}$ to the pulse generator 230. In this case, the activation event corresponds to the start of the periodic interval during which the activation signal $S_{act}$ is generated and sent. Such a timer being known per se, it will not be detailed further here.

Figure 5:
FIG. 5 is an example of an activation signal generated by the detection module and of the power amplification device of FIG. 2.

The activation signal $S_{act}$ may be a TTL (Transistor-Transistor Logic) signal known per se, corresponding to a voltage step of which the amplitude is equal to the first supply voltage BT1, for example 5V, as illustrated in FIG. 5.

The pulse generator 230 is configured to receive an activation signal $S_{act}$ from the detection sub-module 220, to generate a pulse command $C_i$ from the second supply voltage BT2, consecutively to receiving said activation signal $S_{act}$ and to transmit said pulse command $C_i$ to the triggering electrode 130 in order to trigger the generation of an electric arc between the first discharge electrode 100 and the second discharge electrode 200.

The invention will now be described in the implementation thereof in reference to FIGS. 3 to 7.

Figure 3:
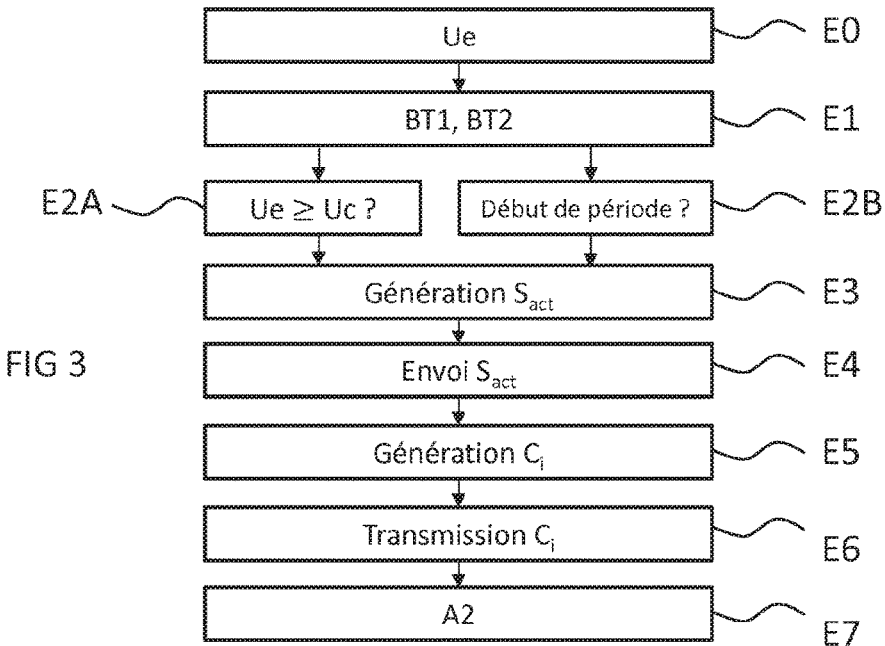
FIG. 3 schematically illustrates an embodiment of the method according to the invention.
Figure 4:
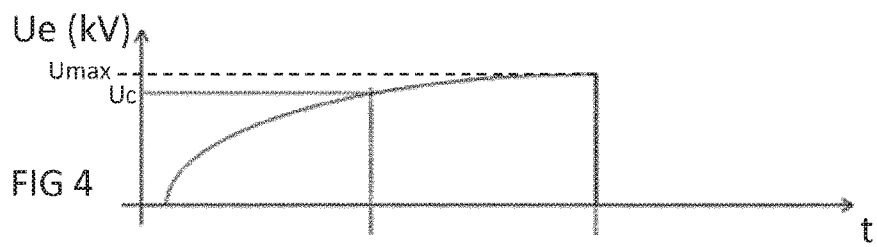
FIG. 4 is an example of an input voltage signal of the power amplification device of FIG. 2.

In reference firstly to FIGS. 3 and 4, the current generator 7 generates in a step E0, a current which defines an input voltage Ue of the power amplification device 10. This input voltage Ue is preferably between 5 and 40 kV. This input voltage Ue, generated by the charge of the condenser(s) of the current generator 7, increases over time until reaching a maximum value Umax for which an electric arc A2 is formed between the first electrode 110 and the second electrode 120 driving the discharge of the condensers of the current generator 7 and the drop of the input voltage Ue to zero.

In a step E1, the converter 210 converts the input voltage Ue delivered by the current generator 7, on the one hand, into a first supply voltage BT1 of the detection sub-module 220 and, on the other hand, into a second supply voltage BT2 of the pulse generator 230. In this non-limiting example, the first supply voltage BT1 is of around 5V and the second supply voltage BT2 is of around 500V.

Also in reference to FIGS. 3 and 4, in a first embodiment implementing the first embodiment of the device 10 presented above, the detection sub-module 220, which also receives the input voltage Ue, permanently compares, in a step E2A, the value of said input voltage Ue with a predetermined threshold value Uc, for example of 30 kV. When the value of the input voltage Ue reaches (i.e. equals) the predetermined threshold value Uc, the detection sub-module 220 generates, in a step E3, an activation signal $S_{act}$ from the first supply voltage BT1 and transmits it to the pulse generator 230 in a step E4. As illustrated in FIG. 5, this activation signal $S_{act}$ is presented in this example in the form of a voltage step of 5V, corresponding to the value of the first supply voltage BT1.

In a second embodiment implementing the second embodiment of the device 10 presented above, the detection sub-module 220 detects the start of the periodic time interval generated by the timer in a step E2B and thus periodically generates the activation signal $S_{act}$ in a step E3, then transmits it to the pulse generator 230 in a step E4. It will be noted, that in the second embodiment using a timer, the voltage for which the electric arc is formed may be defined by adapting the charge time of the condensers such that it corresponds to the period of the timer.

Figure 6:
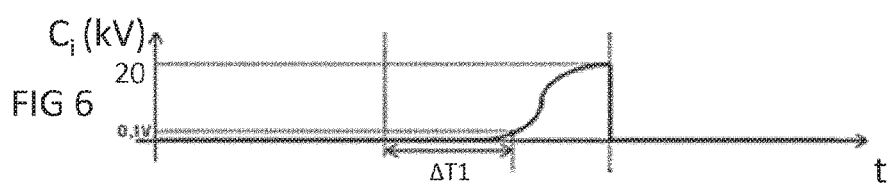
FIG. 6 is an example of a pulse command generated by the pulse generator of the power amplification device of FIG. 2.
Figure 7:
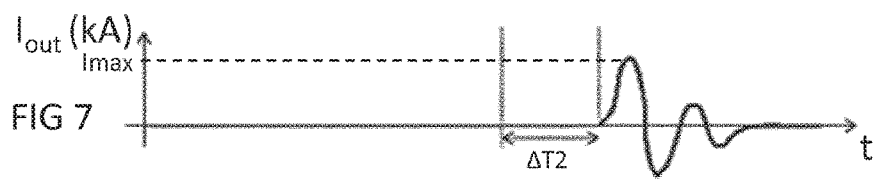
FIG. 7 is an example of an output current signal of the power amplification device of FIG. 2.

In reference to FIG. 6, when it receives this activation signal $S_{act}$, the pulse generator 230 itself generates, in a step E5, a pulse command $C_i$ from the second supply voltage BT2 generated and provided by the converter 210. This pulse command is transmitted in a step E6 to the triggering electrode 130.

In this example, the pulse command $C_i$ is presented in the form of a voltage pulse signal starting at the end of the delay $\Delta T1$, the start of this voltage peak being detected when the voltage exceeds a minimum threshold value. This minimum threshold value may be equal to 10% of the maximum voltage, that is, for example, a minimum threshold value of 0.1V. This delay $\Delta T1$ corresponds to the time elapsed between the detection of the threshold Uc and the generation of the triggering pulse $C_i$. The pulse signal increases, for a delay $\Delta T2$ comprised in this example between 0.5 and 10 µs after the start thereof, to a maximum value of 20 kV.

During this increase of the voltage at the terminals of the triggering electrode 130, an ionised air channel A1 is created between the first discharge electrode 110 and the second discharge electrode 120. When the voltage reaches the predetermined threshold value or the end of the timer period, the main electric arc A2 is generated, in a step E7, between the first discharge electrode 110 and the second discharge electrode 120.

The input voltage Ue thus instantaneously drops to zero, in the same way as the voltage value of the activation signal $S_{act}$ (end of the voltage step) and as the voltage value of the pulse command $C_i$. In reference to FIG. 7, the formation of the electric arc A2 generates an oscillating output current $I_{out}$ of which the value may be between, in this example, 10 and 30 kA.

The invention therefore makes it possible to trigger a shot by using a triggering electrode 130 without using an external voltage supply, the supply of the triggering generator 230 being achieved by the second voltage BT2 generated by the voltage converter 210. The triggered power amplification device 10 according to the invention therefore only requires one single external supply (current generator 7), which reduces the number of cables and makes it possible to easily use it in places that are difficult to access such as boreholes, while making it possible for a triggering of the shots at a constant threshold value, using the triggering electrode.

It must be noted that the present invention is not limited to the examples described above, and it is likely to have numerous variants accessible to a person skilled in the art.

The invention claimed is:

1. Power amplification device capable of being powered by one single input voltage and comprising a switching module, said switching module comprising a first discharge electrode and a second discharge electrode, arranged opposite one another at a predetermined set distance defining a space for generating an electric arc, and a triggering means located near said space and being configured to trigger the formation of said electric arc in said space, said power amplification device comprising a triggering module configured to:
   convert the input voltage into a first supply voltage and into a second supply voltage,
   detect an activation event,
   generate, from the first supply voltage, an activation signal when an activation event has been detected,
   generate, from the second supply voltage, a pulse command when an activation signal has been generated, and
   transmit the pulse command generated to the triggering means of the switching module, so that the triggering means triggers the formation of an electric arc between the first discharge electrode and the second discharge electrode.

2. Power amplification device according to claim 1, wherein the triggering module is configured to compare the value of the input voltage with a predetermined threshold value and to generate the activation signal when the value of the input voltage is greater than or equal to the predetermined threshold value.

3. Power amplification device according to claim 1, wherein the triggering module comprises a timer and is configured to generate the activation signal periodically relying on said timer.

4. Power amplification device according to claim 1, wherein the value of the first voltage is between 1 and 10V.

5. Power amplification device according to claim 1, wherein the activation signal is presented in the form of a voltage step of which the amplitude is equal to the value of the first voltage.

6. Power amplification device according to claim 1, wherein the value of the second voltage is around several hundred Volts.

7. Power amplification device according to claim 1, wherein the pulse command is presented in the form of a voltage pulse signal of which the duration is between 0.5 and 10 µs.

8. Power amplification device according to claim 7, wherein the voltage pulse signal reaches a maximum value of around 20 kV, making it possible for the triggering means to trigger the formation of the electric arc between the first discharge electrode and the second discharge electrode.

9. Power amplification system comprising a power amplification device according to claim 8 and a current generator delivering a voltage of between 5 and 40 kV at the input of said power amplification device.

10. Method for generating an electric arc between a first discharge electrode and a second discharge electrode, arranged opposite one another at a predetermined set distance defining a space for generating an electric arc, the generation of said electric arc being triggered by a triggering means located near said space, said method, implemented by a power amplification device powered by an input voltage, comprising the steps of:

converting the input voltage into a first supply voltage and into a second supply voltage,
   detecting an activation event,
   generating, from the first supply voltage, an activation signal when an activation event has been detected,
   generating, from the second supply voltage, a pulse command when an activation signal has been generated, and
   transmitting said pulse command generated by the triggering means, so that the triggering means triggers the formation of an electric arc between the first discharge electrode and the second discharge electrode.

\* \* \* \* \*